United States Patent [19]

Rouse

[11] Patent Number: 5,017,986

[45] Date of Patent: May 21, 1991

[54] OPTICAL DEVICE MOUNTING APPARATUS

[75] Inventor: David M. Rouse, Granville, Ohio

[73] Assignee: AT&T Bell Laboratories, Murray Hill, N.J.

[21] Appl. No.: 399,648

[22] Filed: Aug. 28, 1989

[51] Int. Cl.$^5$ .................. G01V 9/04; H01L 27/14; H01L 31/06

[52] U.S. Cl. .................. 357/30; 357/30 M; 357/19; 250/211 R; 350/3.73

[58] Field of Search .................. 357/74, 30 L, 30 M

[56] References Cited

U.S. PATENT DOCUMENTS

| | | | |
|---|---|---|---|
| 3,924,879 | 12/1975 | Wright | 282/28 |
| 3,969,751 | 7/1976 | Drukaroff et al. | 357/30 L |
| 4,124,860 | 11/1978 | Johnson | 357/19 |
| 4,514,581 | 4/1985 | Fan et al. | 357/30 L |
| 4,603,258 | 7/1986 | Sher et al. | 357/30 H |
| 4,672,457 | 6/1987 | Hyatt | 358/60 |
| 4,752,816 | 6/1988 | Sussman et al. | 357/30 |
| 4,820,649 | 4/1989 | Kawaguchi et al. | 436/501 |
| 4,826,311 | 5/1989 | Ledebuhr | 353/31 |
| 4,830,444 | 5/1989 | Cloonan et al. | 350/3.73 |
| 4,872,755 | 10/1989 | Küchel | 356/360 |
| 4,876,446 | 10/1989 | Kambe et al. | 250/221 |
| 4,894,835 | 1/1990 | Uomi et al. | 372/45 |
| 4,916,501 | 4/1990 | Thenoz et al. | 357/30 H |

FOREIGN PATENT DOCUMENTS 58-44777  3/1983  Japan .
61-84860  4/1986  Japan .

Primary Examiner—Andrew J. James
Assistant Examiner—Viet Q. Nguyen
Attorney, Agent, or Firm—D. A. Marshall

[57] ABSTRACT

Apparatus for mounting and interconnecting optical devices. The apparatus comprises generally rectangular members constructed of optical transparent material formed with recesses having sides positioned at angles with respect to a line perpendicular to a surface of the apparatus. Reflective material is selectively coated on ones of the recess sides such that a parallel coherent light beam emitted by one optical device mounted on the surface of the apparatus is reflected by the light reflective material of one recess side internally through the apparatus to the light reflective material of another recess side whereat it is reflected to optical devices mounted on the apparatus surface.

8 Claims, 3 Drawing Sheets

OPTICAL DEVICE MOUNTING APPARATUS

TECHNICAL FIELD

The invention relates to apparatus for mounting and interconnecting optical devices in optoelectronic equipment.

BACKGROUND AND PROBLEM

Circuit boards are widely used in the Electrical and Electronics Industry in the manufacture of electrical and electronic equipment. Such circuit boards are prepared with printed wiring used to interconnect electrical components that are mounted on the circuit board and which form the elements of the electrical and electronic equipment. Typically, such boards are installed in mounting apparatus and coupled together to form the large complex circuitry of the electrical and electronic equipment, such as computer electronic switching systems, used in communication networks.

Electrical and electronic equipment is increasingly using optical devices to improve both the capacity and speed of the equipment, oftentimes called optoelectronic equipment, in handling information. Such optical devices are interconnected by optical fiber conductors so that a beam of light emitted by a transmitting optical device is transmitted by an optical fiber conductor to a receiving optical device. The optical fiber conductors require elaborate and unwieldy connections, connector and optical fiber apparatus to aline and connect each optical fiber conductor with both transmitting and receiving optical devices. As the technology of optical devices continues to improve, optical devices decrease in size such that several optical devices could be mounted on a circuit board for installation into circuit board mounting apparatus of optoelectronic equipment. A problem arises in attempting to mount optical devices on a circuit board in that the elaborate and unwiedly connections, connector and optical fiber apparatus necessary for the interconnection of the optical devices requires space that is not available on present types of circuit boards.

SOLUTION

The foregoing problem is solved by apparatus for mounting and interconnecting optical devices and which apparatus is arranged to be inserted as a circuit board in optoelectronic equipment mounting apparatus. The mounting and interconnecting apparatus comprises a generally rectangular configured member formed of an optical transparent material having recesses located therein with sides each formed at an angle with respect to a line perpendicular to a mounting surface intended to mount optical devices. Selected ones of the recess sides corresponding with transmitter and receiver sections of optical devices mounted on the mounting surface are coated with a light reflecting material for receiving a light beam emitted by an optical device. The received light beam is deflected by one recess through the optical transparent material of the member to another recess whereat the received light beam is deflected to another optical device mounted on the mounting surface. Terminal pads are deposited on the optical device mounting surface with each terminal pad corresponding with a terminal of the each mounted optical device and are selectively connected by conductor paths deposited on the mounting surface for electrically interconnecting ones of the mounted optical devices and for interconnecting the mounted optical devices with electrical power and control signals furnished by optoelectronic equipment mounting apparatus.

DETAILED DESCRIPTION

Figure 1:
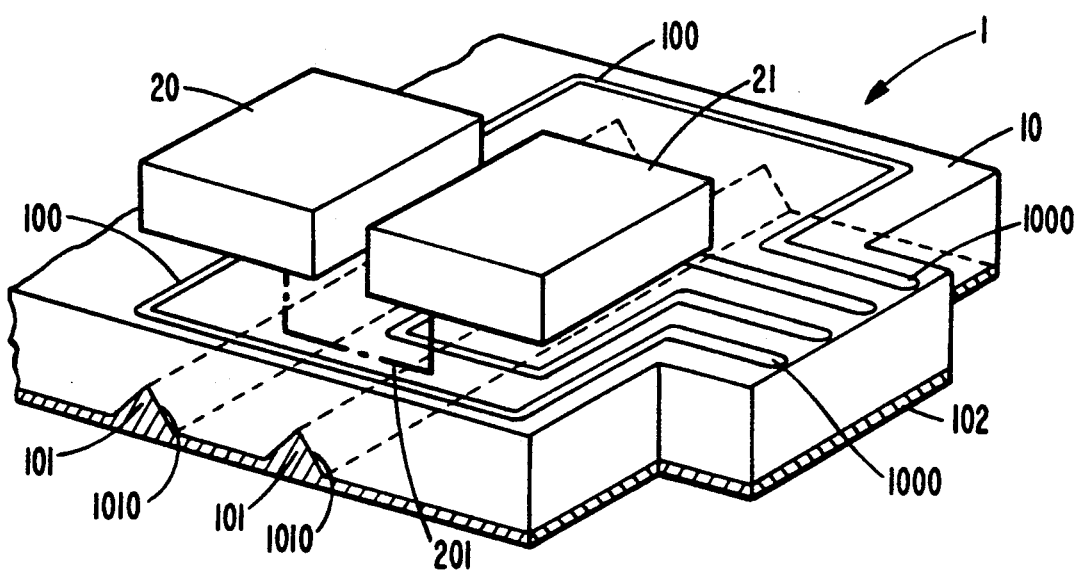
FIG. 1 is an oblique view of apparatus for mounting and interconnecting optical devices in accordance with the principles of the invention.

In an exemplary embodiment of the invention, FIG. 1, apparatus 1 for mounting and interconnecting optical devices 20, 21 comprises a generally rectangularly configured member 10 in a general configuration of a circuit board formed of an optically transparent material. Electrically conducting paths 100 formed of an electrically conducting material, such as copper or copper alloy, are deposited on a surface mounting optical devices 20, 21 to electrically interconnect optical devices and components mounted thereon. Each conductor path 100 is terminated in a terminal pad positioned on the surface of member 10 to correspond with a terminal of an optical device 20, 21 so that when optical devices 20, 21 are mounted on member 10, terminals thereof are engaged with a conducting path terminal pad to electrically interconnect optical devices 20, 21 and other components. Various ones of conducting paths 100 may also be terminated in terminal fingers 1000 arranged to be inserted in a connector of equipment mounting apparatus so that battery, ground and signaling leads may be electrically connected with optical devices 20, 21 to both externally power and control operation thereof. Although not shown in the drawing, a connector may be installed on member 10 and connected with conducting paths 100 such member 10 may be installed in equipment mounting apparatus by engaging the connector with male pins of the equipment mounting apparatus.

Figure 7:
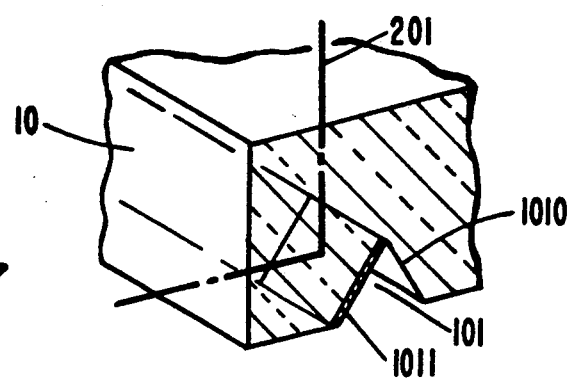
FIG. 7 illustrates a channel of the mounting apparatus set forth in FIGS. 1, 3, 4, 5 and 6 selectively coated with light reflecting material to receive a light beam emitted by an optical device and deflect the received light beam through optical transparent material of the mounting and interconnection apparatus.

Recesses, which may be in the form of a plurality of parallel channels 101, are located on one surface of member 10. Each channel 101 has sides 1010 wherein each side 1010 is formed at an angle with respect to a line perpendicular to the surface of member 10 mounting optical devices 20, 21. Ones of the channel sides 1010, FIG. 7, positioned to correspond with an optical device 20, 21 mounted on a surface of member 10 are selectively coated with a light reflecting material 1011, such as borosilicate, although not limited thereto, such that a parallel coherent light beam 201 emitted by an optical device 20, 21 is received by channel side 1010 and reflected by light reflecting material 1011 coated on channel side 1010 through the optical transparent material of member 10 to another channel 101.

In final assembly, FIG. 1, optical devices 20, 21 are mounted on member 10 by using an ultraviolet optically clear adhesive coating, such as No. A61, having an index of refraction of 1.52 with respect to the optical transparent material of member 10 such that each terminal of optical devices 20, 21 is engaged with a corresponding terminal pad of a conductor path 100. In addition, a coating material 102, also having an index of refraction of 1.52 with respect to the optical transparent material of member 10, is coated on member 10 and fills channels 101 and coats the conductor paths 100 with the exception of fingers 1000 or the connector terminating conductor paths 100 which are left uncovered to engage corresponding terminals of the equipment mounting apparatus.

Electrical signals appearing on conductor paths 100 power and control the operation of mounted optical devices 20, 21. A light beam 201 emitted from mounted optical device 21 is received by a side 1010 of a channel 101 and deflected by light reflecting coating 1011 through the optical transparent material of member 10 to a side 1010 of another channel 101 positioned with respect to optical device 20 such that the emitted light beam 201 received by the other channel side 1010 is deflected by the light reflecting material 1011 coated thereon to receiving optical device 20. Thus, member 10 both mounts and interconnects optical devices such as optical devices 20 and 21.

Figure 2:
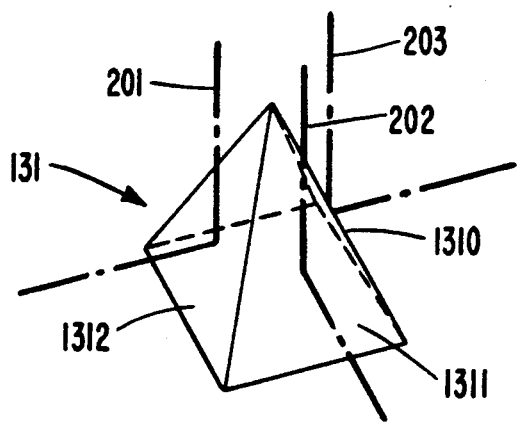
FIG. 2 illustrates an aperture that may be formed in the mounting and interconnecting apparatus set forth in FIG. 1 for use in deflecting light beams.

In another embodiment of the invention, recesses located within member 10 for receiving and deflecting light beams may be a plurality of apertures 131, FIG. 2, formed in the surfaces of member 10 to correspond with various locations of mounted optical devices 20, 21. Apertures 131 have a generally polyhedral configuration wherein sides, such as sides 1310, 1311 and 1312, are each formed at angles with respect to a line perpendicular to the optical device mounting surface of member 10. Selected sides 1310, 1311 and 1312 are coated with light reflecting material so that light beams 201, 202 and 203 emitted by optical devices 20, 21 mounted on member 10 are received and deflected through the optical transparent material of member 10 to other ones of apertures 131 whereat the received light beams 201, 202 and 203 are again deflected to another mounted optical device. Thus, apertures 131 enable a number of optical devices, such as optical devices 20, 21, to be mounted at various locations on mounting apparatus 1.

Figure 3:
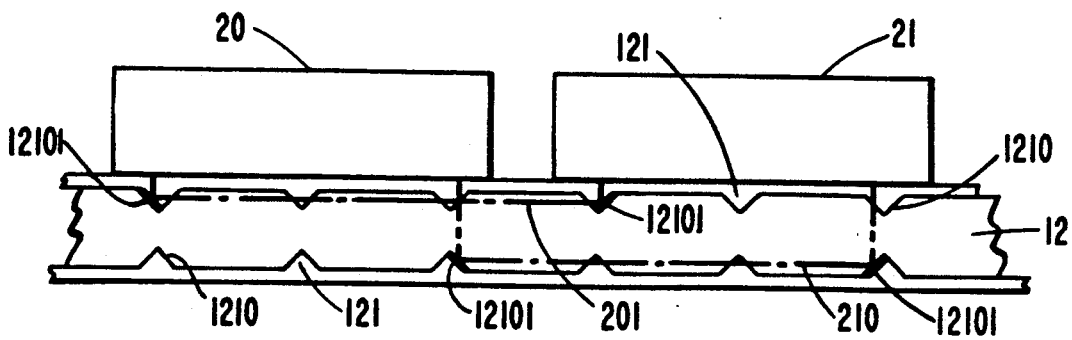
FIG. 3 illustrates a sectional view of an embodiment of the apparatus set forth in FIG. 1 having top and bottom channels for use in deflecting light beams between optical devices mounted on the apparatus.

As set forth in FIG. 3 of the drawing, a plurality of parallel channels 121 may be formed on opposing surfaces of member 12 which is constructed of optical transparent material. Each side 1210 of channels 121 is formed at an angle which may be, although not limited to, 45 degrees with respect to a line perpendicular to a surface of member 12 mounting optical devices 20, 21. Selected areas of channel sides 1210 are coated with light reflecting material 12101 to receive and deflect light beams 201, 210 through the optical transparent material of member 12. In operation, a transmitter section of optical device 21 mounted on member 12 emits a light beam 201 which is received by a light reflecting side 12101 of a channel 121 associated with optical device 21 and deflected through the optical transparent material of member 12 to another channel 121 associated with mounted optical device 20. Light beam 201 is received by the light reflecting side 12101 of channel 121 and deflected to a receiver section of mounted optical device 20. A transmitter section of optical device 20 is also enabled to transmit light beam 210 to a light reflecting side 12101 of channel 121 wherein it is deflected through optical transparent material of member 12 to another light reflecting channel side 12101 located in association with optical device 21 whereat the received light beam 210 is deflected to the receiver section of optical device 21. Light beams 201 and 210 are sufficiently displaced with respect to each other within the optical transparent material of member 12 so as not to interfere with each other.

Figure 4:
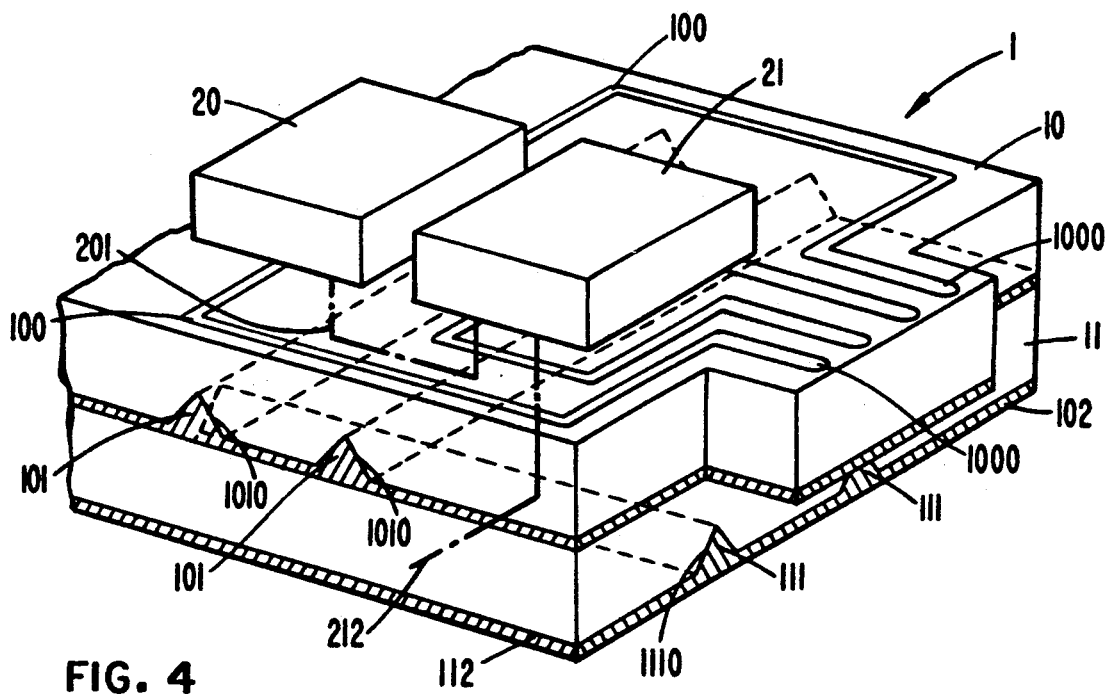
FIG. 4 is an oblique view of members each rotated with respect to the other to form apparatus for mounting and interconnecting optical devices in accordance with the principles of the invention.

In yet another embodiment of the invention, FIG. 4, the optical device mounting and interconnection apparatus 1 comprises a pair, although not limited thereto, of generally rectangularly configured members 10, 11 formed of optical transparent material. Each member 10, 11 has a plurality of parallel channels 101, 111 formed on surfaces of each member 10, 12 to correspond with optical devices 20 and 21 mounted on either one or opposing surfaces of members 10, 11.

In the construction of mounting apparatus 1 set forth in FIG. 4, one member, for example member 10, is assembled on top of other member 11 such that channels 111 of member 11 are rotated at an angle with respect to channels 101 of member 10. Member 10 is bonded to member 11 by using the aforementioned ultraviolet optically clear adhesive coating 102 with respect to the optical transparent material of members 10 and 11. In a manner similar to that for mounting apparatus 1 set forth in FIG. 1, the coating material 102, 112, FIG. 4, is coated on members 10 and 11 to fill channels 101, 111 and cover conductor paths 100 with the exception of the fingers 1000 or a connector terminating conductor paths 100 which are left uncovered to engage corresponding terminals of equipment mounting apparatus.

Light beam 201 emitted by optical device 21 is received by selectively coated sides 1010 of channels 101 and deflected through the optical transparent material of member 10 to optical device 20. A second light beam 212 also emitted by optical device 21 is transmitted through the optical transparent material of members 10, 11, received by a selectively coated side 1110 of one channel 111, deflected through the optical transparent material of member 11 to another channel side wall 1110 where it is deflected through members 11 and 10 to yet another optical device, not shown, which may be mounted on mounting apparatus 1 adjacent to optical devices 20 and 21.

Figure 5:
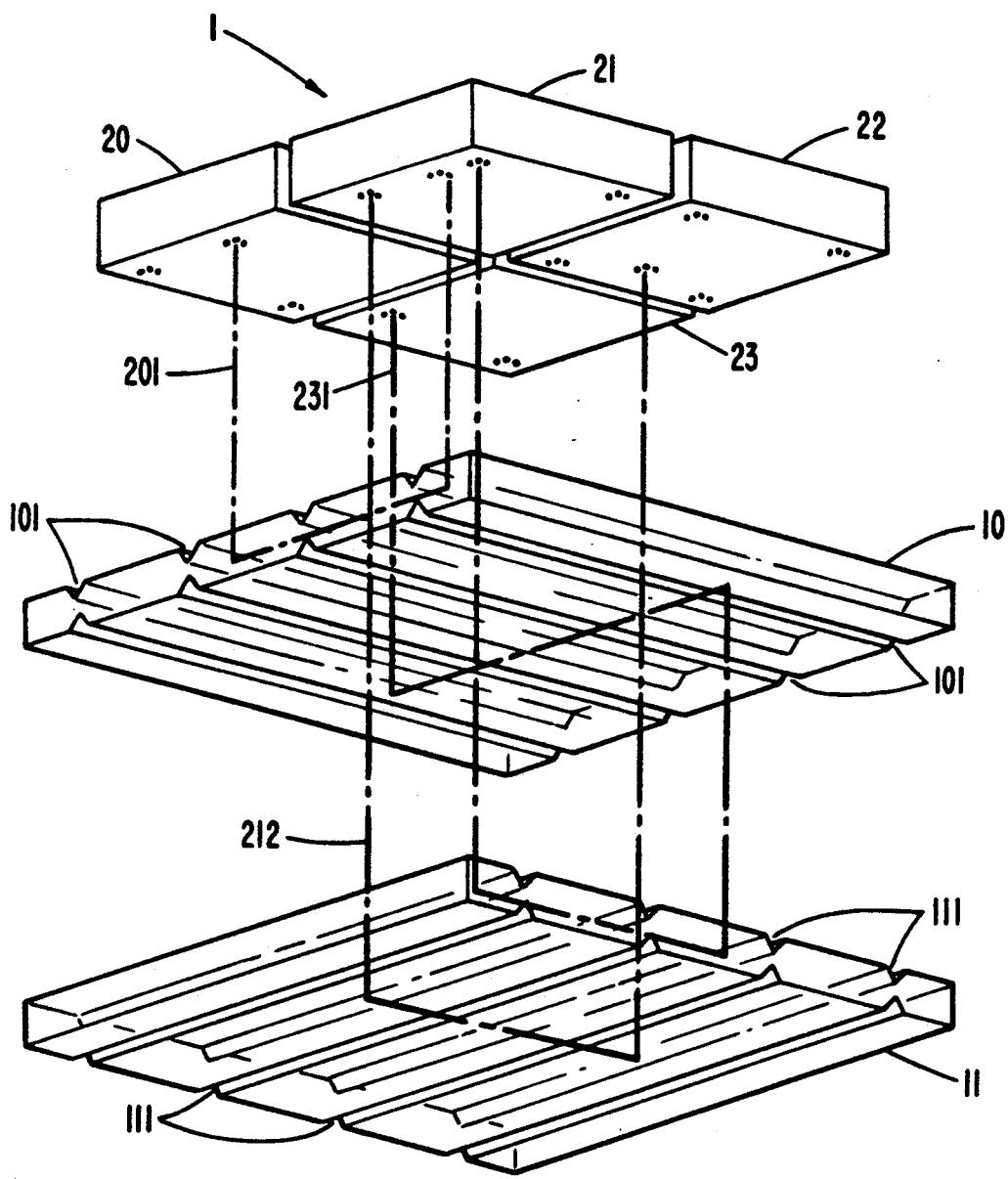
FIG. 5 is an exploded view of the apparatus set forth in FIG. 4 showing the deflection of light beams to interconnect optical devices mounted on a surface of the apparatus.

Mounting apparatus 1, FIG. 5, may be formed of two members 10 and 11 wherein each member 10 and 11, rotated at a right angle with respect to the other, may have a plurality of channels 101, 111 formed on opposing surfaces of members 10 and 11, respectively. A plurality of optical devices 20, 21, 22 and 23 may be mounted on a surface of either or on both members 10 and 11. Thus, light beams, such as light beam 201 emitted by optical device 20, may be received by a light reflecting side of channel 101 and deflected through the optical transparent material of member 10 and a side of another channel 101 to optical device 21. Similarly, light beam 212 emitted by optical device 21 is transmitted through the optical transparent material of member 10 to be received and deflected by sides of channel 111 through the optical transparent material of member 11 to another channel side whereat it is deflected through the optical transparent material of member 10 to optical device 22.

In yet another application, a light beam 231 emitted by optical device 23 is transmitted through member 10, received by a channel 101, deflected through member 10 to another channel 101 whereat it is deflected to a channel 111 of member 11. At channel 111 the received light beam 231 is deflected through member 11 to another channel 111 whereat the received light beam is deflected through member 10 to optical device 21. Thus, a plurality of optical devices 20, 21, 22 and 23 may be mounted on mounting apparatus 1 and optically interconnected wherein light beams emitted from transmitter sections of the optical devices may be deflected by recesses, such as channels and apertures of the members comprising the mounting apparatus, to receiver sections of the optical devices thereby optically interconnecting the optical devices.

Figure 6:
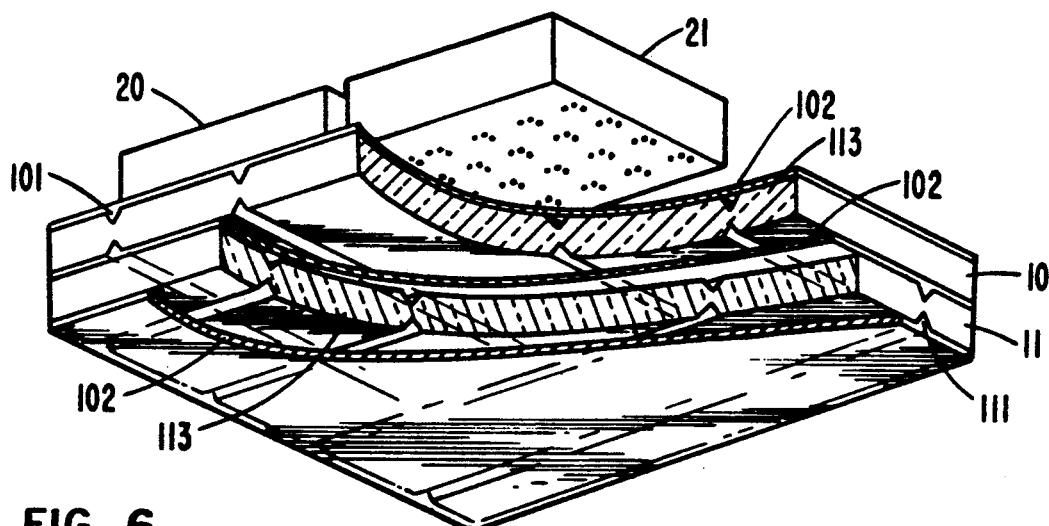
FIG. 6 is a partial sectional view illustrating a constructional view of apparatus of the type set forth in FIG. 3 with each member rotated with respect to the other to form another embodiment of apparatus in accordance with principles of the invention.

In construction, FIG. 6, the mounting apparatus 1 set forth in FIG. 5, has members 10 and 11 formed of optical transparent material 113 which are affixed together by the aforementioned adhesive coating material 102. Optical devices 20 and 21 are mounted on one or opposing surfaces of members 10, 11 and mounting apparatus 1 coated with the adhesive coating material 102 to seal and protect the structure.

I claim:

1. Apparatus for mounting and interconnecting optical devices comprising:
   means formed of an optical transparent material and having recesses located therein with sides thereof each formed at an acute angle with respect to a line perpendicular to a mounting surface of said means and wherein selected ones of said recess sides are coated with a light reflecting material for receiving multiple parallel coherent light beams emitted by optical devices mounted on said mounting surface and deflecting said multiple light beams through said optical transparent material to others of said coated recess sides for receiving ones of said deflected light beams and deflecting said received one light beams through said optical transparent material to other said mounted optical devices.

2. The optical device mounting and interconnecting apparatus set forth in claim 1 wherein said recesses comprise:
   a plurality of channels formed in surfaces of said optical transparent material with each channel having a side formed at said acute angle with respect to said perpendicular line and with ones of said channel sides selectively coated with said light reflecting material for receiving said emitted light beams and deflecting said light beams through said optical transparent material to optically interconnect mounted optical devices.

3. The optical device mounting and interconnecting apparatus set forth in claim 2 wherein said mounting and interconnecting apparatus comprises:
   a pair of generally rectangular configured members each formed of said optical transparent material with parallel ones of said channels formed in opposing surfaces of each of said members and wherein said members are assembled one on top of the other with channels of one member rotated at a right angle with respect to channels of the other member and with selected ones of said channel sides coated with said light reflecting material for receiving said multiple light beams emitted by optical devices mounted on mounting surfaces of ones said members and deflecting said multiple light beams through said optical transparent material to interconnect multiple ones of said mounted optical devices.

4. The optical device mounting and interconnecting apparatus set forth in claim 3 wherein said mounting and interconnecting apparatus recesses comprise:
   a plurality of terminal pads deposited on ones of said optical device mounting surfaces with each terminal pad corresponding with a terminal of one of said optical devices and selectively connected by conductor paths deposited on said mounting surfaces for electrically interconnecting said ones of said mounted optical devices to both externally power and control operation thereof.

5. The optical device mounting and interconnecting apparatus set forth in claim 1 wherein said mounting and interconnecting apparatus recesses comprise:
   a plurality of apertures formed in surfaces of said mounting and interconnecting apparatus with each aperture having a generally polyhedral configuration wherein sides thereof are formed at acute angles with respect to said line perpendicular to said mounting surface and are selectively coated with said light reflecting material for receiving said emitted light beams and deflecting said light beams through said optical transparent material to optically interconnect ones of said mounted optical devices.

6. Apparatus for mounting and interconnecting optical devices comprising:
   a generally rectangular configured member formed of an optical transparent material and having a plurality of parallel channels located therein with sides thereof each formed at an acute angle with respect to a line perpendicular to a mounting surface of said member and wherein specific areas of said channel sides are coated with a light reflecting material for receiving multiple parallel coherent light beams emitted by ones of the optical devices mounted on said mounting surface and deflecting said multiple light beams through said optical transparent material to other areas of said channel sides coated with said light reflecting material for receiving said deflected light beams and deflecting said received light beams through said optical transparent material to other ones of the optical devices mounted on said mounting surface.

7. Apparatus for mounting and interconnecting optical devices comprising:
   a generally rectangular configured member formed of an optical transparent material having a plurality of apertures located therein for optically interconnecting optical devices mounted on a mounting surface of said member and wherein each aperture has a generally polyhedral configuration with sides thereof formed at acute angles with respect to a line perpendicular to said mounting surface and which sides are selectively coated with a light reflecting material to deflect multiple parallel coherent light beams emitted from ones of said mounted optical devices through said optical transparent material to other ones of said apertures wherein coated aperture sides of said other apertures deflect said emitted light beams to other ones of said mounted optical devices.

8. Apparatus for mounting and interconnecting optical devices comprising:

a pair of generally rectangular configured members each formed of optical transparent material with parallel channels formed in opposing surfaces of each of said members and wherein said members are assembled one on top of the other with channels of one member rotated at a right angle with respect to channels of the other member and with sides of said channels formed at acute angles with respect to a line perpendicular to an optical device mounting surface and selectively coated with a light reflecting material and which members have a plurality of terminal pads deposited on said mounting surface of said assembled members for use in mounting said optical devices on said mounting surface with each terminal pad corresponding with a terminal of one of said optical devices and with said terminal pads selectively interconnected by conductor paths deposited on said mounting surface for electrically interconnecting said mounted optical devices to both externally power and control operation thereof and wherein ones of said coated channel sides are positioned for receiving multiple parallel coherent light beams emitted by optical devices mounted on said mounting surface of said members and deflecting said multiple parallel coherent light beams through said optical transparent material to other ones of said coated channel sides for deflection to ones of said mounted optical devices.

* * * * *